(12) United States Patent
Liaw

(10) Patent No.: US 11,171,139 B2
(45) Date of Patent: Nov. 9, 2021

(54) TRANSISTORS WITH VARIOUS THRESHOLD VOLTAGES AND METHOD FOR MANUFACTURING THE SAME

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/707,809

(22) Filed: Dec. 9, 2019

(65) Prior Publication Data
US 2020/0119016 A1 Apr. 16, 2020

Related U.S. Application Data

(63) Continuation of application No. 15/853,542, filed on Dec. 22, 2017, now Pat. No. 10,504,899.

(60) Provisional application No. 62/592,776, filed on Nov. 30, 2017.

(51) Int. Cl.
| | |
|---|---|
| *H01L 27/092* | (2006.01) |
| *H01L 21/762* | (2006.01) |
| *H01L 29/06* | (2006.01) |
| *H01L 29/78* | (2006.01) |
| *H01L 29/66* | (2006.01) |
| *H01L 21/8238* | (2006.01) |

(52) U.S. Cl.
CPC ........ *H01L 27/0924* (2013.01); *H01L 21/762* (2013.01); *H01L 21/823821* (2013.01); *H01L 29/0615* (2013.01); *H01L 29/66818* (2013.01); *H01L 29/785* (2013.01); *H01L 21/76224* (2013.01)

(58) Field of Classification Search
CPC ............. H01L 27/0924; H01L 27/0207; H01L 27/105–11597; H01L 27/1211; H01L 27/085–098; H01L 29/36–365; H01L 27/11; H01L 27/1104; H01L 27/1108; H01L 27/1116; H01L 27/092
See application file for complete search history.

(56) References Cited

U.S. PATENT DOCUMENTS

| | | | | |
|---|---|---|---|---|
| 4,161,038 | A | * | 7/1979 | Wu .......................... G11C 11/22 257/295 |
| 5,190,888 | A | * | 3/1993 | Schwalke ......... H01L 21/28052 438/228 |
| 5,242,841 | A | * | 9/1993 | Smayling ........ H01L 21/823456 148/DIG. 151 |
| 5,396,100 | A | | 3/1995 | Yamasaki et al. |
| 5,512,771 | A | * | 4/1996 | Hiroki ............. H01L 21/823857 257/369 |

(Continued)

*Primary Examiner* — Scott B Geyer
(74) *Attorney, Agent, or Firm* — Maschoff Brennan

(57) ABSTRACT

A semiconductor device includes a first cell and a second cell. The first cell includes a first circuit, and the first circuit includes a first gate. The second cell is disposed adjacent the first cell and includes a second circuit which includes a second gate. The doping concentration of the first circuit is different from that of the second circuit, and the first gate and the second gate have the same gate critical dimension. A method for manufacturing the semiconductor device is also disclosed herein.

20 Claims, 11 Drawing Sheets

(56) References Cited

U.S. PATENT DOCUMENTS

| | | | |
|---|---|---|---|
| 5,563,427 A * | 10/1996 | Yudasaka | H01L 27/127 257/72 |
| 5,830,788 A * | 11/1998 | Hiroki | H01L 27/0922 438/199 |
| 5,981,324 A * | 11/1999 | Seo | H01L 27/1052 257/E21.645 |
| 6,313,511 B1 | 11/2001 | Noguchi | |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,515,077 B1 | 12/2016 | Liaw | |
| 9,520,482 B1 | 12/2016 | Chang et al. | |
| 9,548,303 B2 | 1/2017 | Lee et al. | |
| 9,576,814 B2 | 2/2017 | Wu et al. | |
| 10,068,909 B1 | 9/2018 | Tseng et al. | |
| 10,504,899 B2 * | 12/2019 | Liaw | H01L 29/66818 |
| 2002/0130314 A1 * | 9/2002 | Yim | H01L 27/11526 257/10 |
| 2006/0108618 A1 * | 5/2006 | Ahn | H01L 27/14609 257/292 |
| 2006/0186454 A1 * | 8/2006 | Lee | H01L 29/42324 257/314 |
| 2008/0179648 A1 * | 7/2008 | Ha | H01L 27/0629 257/296 |
| 2012/0153387 A1 | 6/2012 | Murthy et al. | |
| 2012/0187504 A1 | 7/2012 | Igarashi | |
| 2014/0048876 A1 * | 2/2014 | Sekiguchi | H01L 29/66674 257/338 |
| 2014/0177312 A1 | 6/2014 | Shibata et al. | |
| 2015/0084133 A1 * | 3/2015 | Xiao | H01L 29/7391 257/369 |
| 2016/0247804 A1 * | 8/2016 | Harada | H01L 27/0928 |
| 2016/0372485 A1 * | 12/2016 | Hook | H01L 29/78648 |
| 2017/0154848 A1 | 6/2017 | Fan et al. | |
| 2017/0317087 A1 | 11/2017 | Chen et al. | |
| 2018/0294261 A1 * | 10/2018 | Liang | H01L 21/823462 |
| 2018/0337188 A1 | 11/2018 | Yu et al. | |

* cited by examiner

TRANSISTORS WITH VARIOUS THRESHOLD VOLTAGES AND METHOD FOR MANUFACTURING THE SAME

RELATED APPLICATIONS

The present application is a continuation of the U.S. application Ser. No. 15/853,542, filed Dec. 22, 2017, issued as U.S. Pat. No. 10,504,899 on Dec. 10, 2019, which claims priority to the U.S. Provisional Application Ser. No. 62/592,776, filed Nov. 30, 2017, all of which are herein incorporated by reference.

BACKGROUND

Metal-Oxide-Semiconductor Field-Effect Transistors (MOSFET) are usually designed to have multiple and wider ranges of threshold voltage Vt to serve for high speed and low standby power application. For Fin Field-Effect Transistor (FinFET), thin fin structures are configured for improving performance of devices. However, the thin fin structures also result in less sensitivity of channel dopant, and therefore the range of threshold voltage Vt is limited. To increase the threshold voltage Vt, heavily doped material is employed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
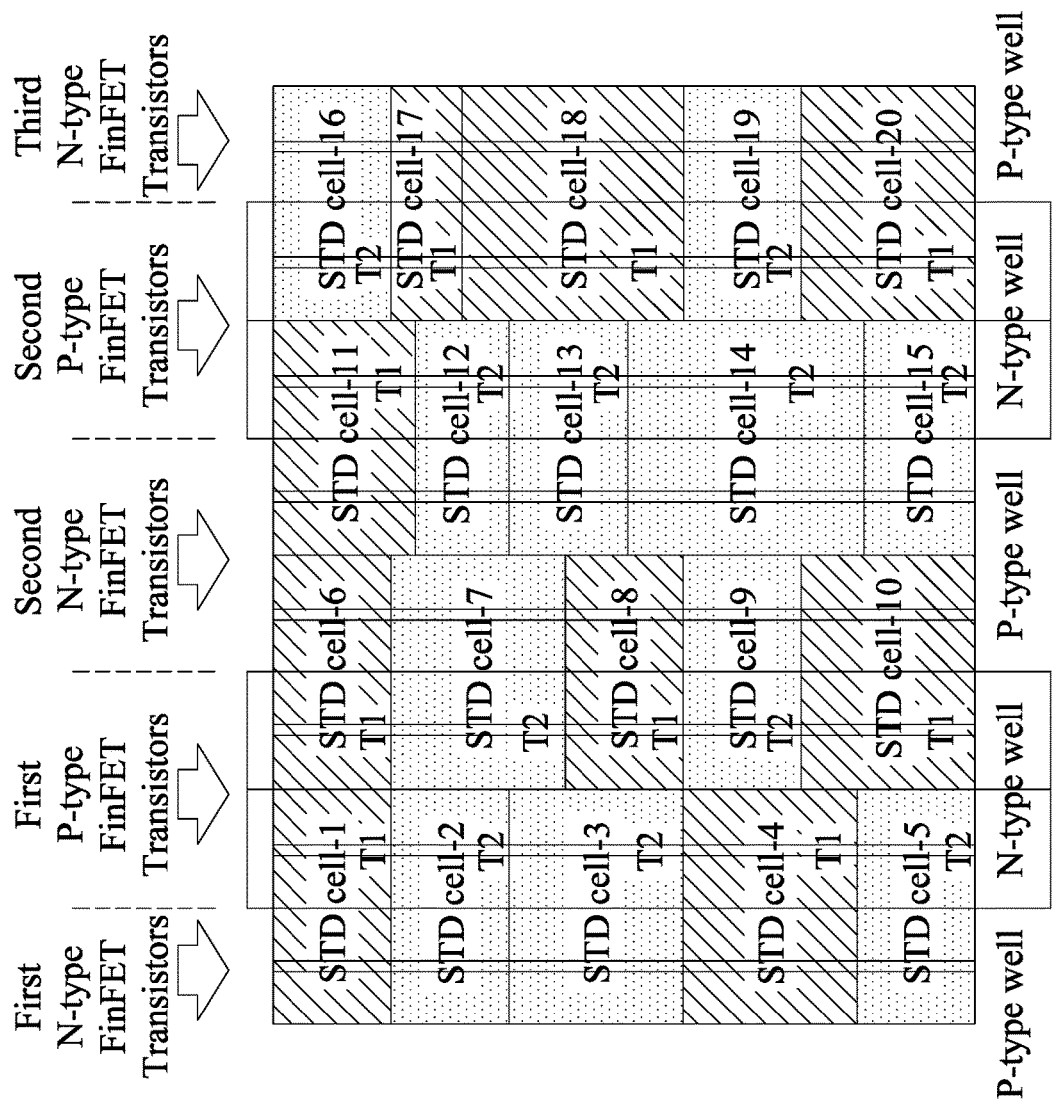
FIG. 1 is a diagram of an array of semiconductor devices, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Reference is now made to FIG. 1. FIG. 1 is a diagram of an array of cells in a semiconductor device, in accordance with various embodiments. As illustrated in FIG. 1, there are standard (STD) cells including, for illustration, STD cell-1~STD cell-20 which are disposed in an array. In some embodiments, the STD cell-1~the STD cell-20 are, but not limited to, inverters, NANDs, NORs, Flip-Flops, or other circuits. The number of STD cells in FIG. 1 is given for illustrative purposes. Various numbers of STD cells are within the contemplated scope of the present disclosure.

In some embodiments, a part of the STD cell-1~the STD cell-20 which are illustrated with oblique lines include first transistors T1. Another part of the STD cell-1~STD cell-20 which are illustrated with mesh points include second transistors T2. For illustration, the STD cell-1, the STD cell-4, the STD cell-6, the STD cell-8, the STD cell-10, the STD cell-11, the STD cell-17, the STD cell-18, and the STD cell-20 are illustrated with oblique lines, and each of these STD cells includes the first transistor T1. On the other hand, the STD cell-2, the STD cell-3, the STD cell-5, the STD cell-7, the STD cell-9, the STD cell-12~the STD cell-15, the STD cell-16, and the STD cell-19 are illustrated with mesh points, and each of these STD cells includes the second transistor T2.

In some embodiments, the first transistors T1 and the second transistors T2 are, for example, P-type Metal-Oxide-Semiconductor Field Effect Transistors (MOSFET). Various types of the transistors T1 and T2 are within the contemplated scope of the present disclosure.

For illustration in FIG. 1 with respect to disposition, the left part of the STD cell-1~the STD cell-5 is configured to form first N-type Fin Field Effect Transistors (FinFET). The right part of the STD cell-1~the STD cell-5 and the left part of the STD cell-6~the STD cell-10 are configured to form first P-type FinFET transistors. In some embodiments, the first transistors T1 and the second transistors T2 are formed as the first P-type FinFET transistors.

In addition, for illustration, the right part of the STD cell-6~the STD cell-10 and the left part of the STD cell-11~the STD cell-15 are configured to form second N-type FinFET transistors. The right part of the STD cell-11~the STD cell-15 and the left part of the STD cell-16~the STD cell-20 are configured to form second P-type FinFET transistors. Moreover, the right part of the STD cell-16~the STD cell-20 is configured to form third N-type FinFET transistors.

Figure 2:
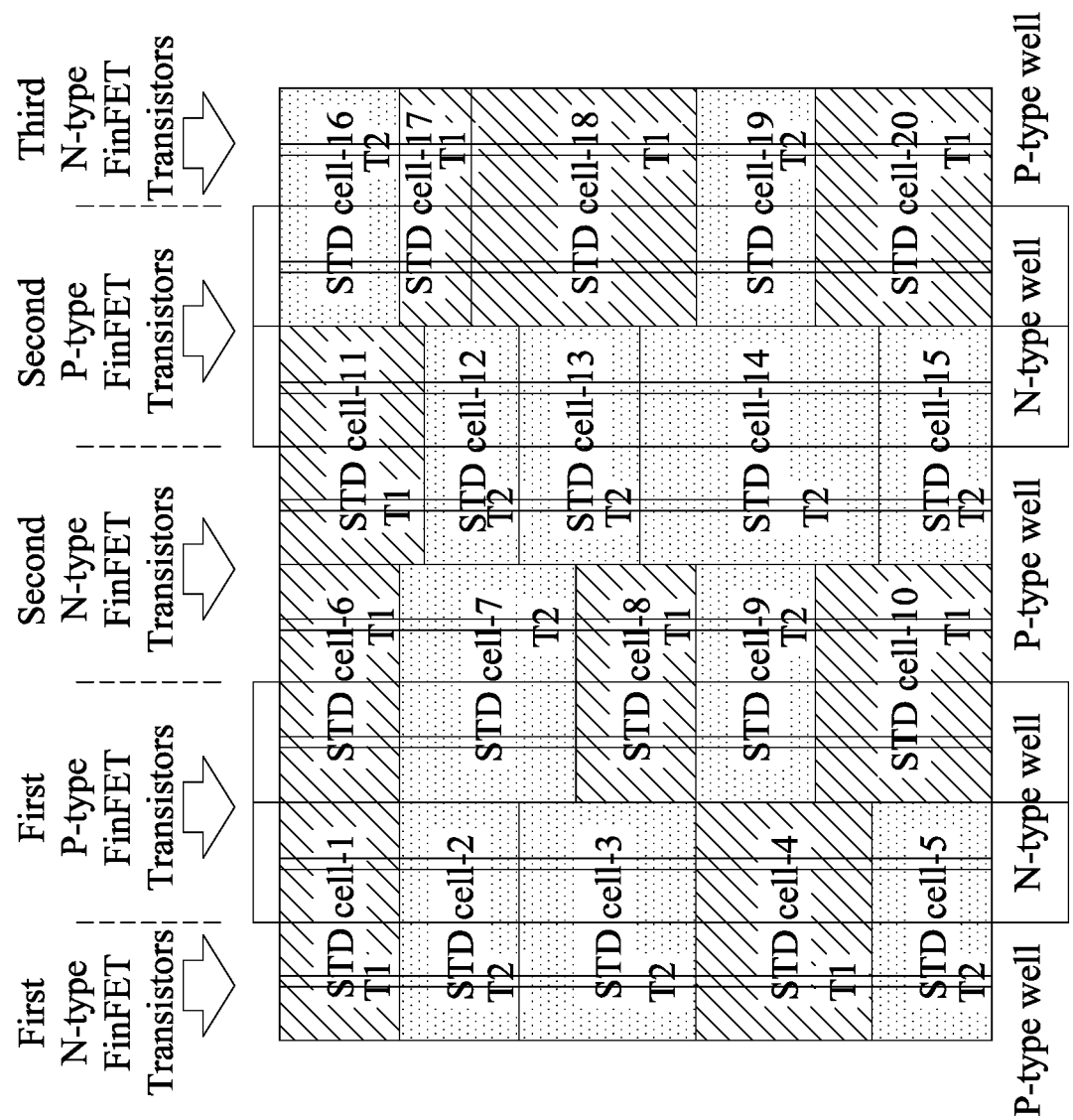
FIG. 2 is a diagram of an array of semiconductor devices, in accordance with various embodiments.

Reference is now made to FIG. 2. FIG. 2 is a diagram of another array of cells in a semiconductor device, in accordance with various embodiments. Similar to FIG. 1, there are STD cells including, for illustration, STD cell-1~STD cell-20 which are disposed in an array in FIG. 2. In some embodiments, the STD cell-1~the STD cell-20 are, but not limited to, inverters, NANDs, NORs, Flip-Flops, or other circuits.

For illustration in FIG. 2 with respect to disposition, the parts of the STD cell-1~the STD cell-20 configured to form N-type and P-type FinFETs are the same as those illustrated in FIG. 1, and thus they are not further detailed herein. Compared to FIG. 1, the first transistors T1 and the second transistor T2 in FIG. 2 are formed as the first N-type FinFET transistors, the second N-type FinFET transistors, and/or the third N-type FinFET transistors, in some embodiments.

Figure 3:
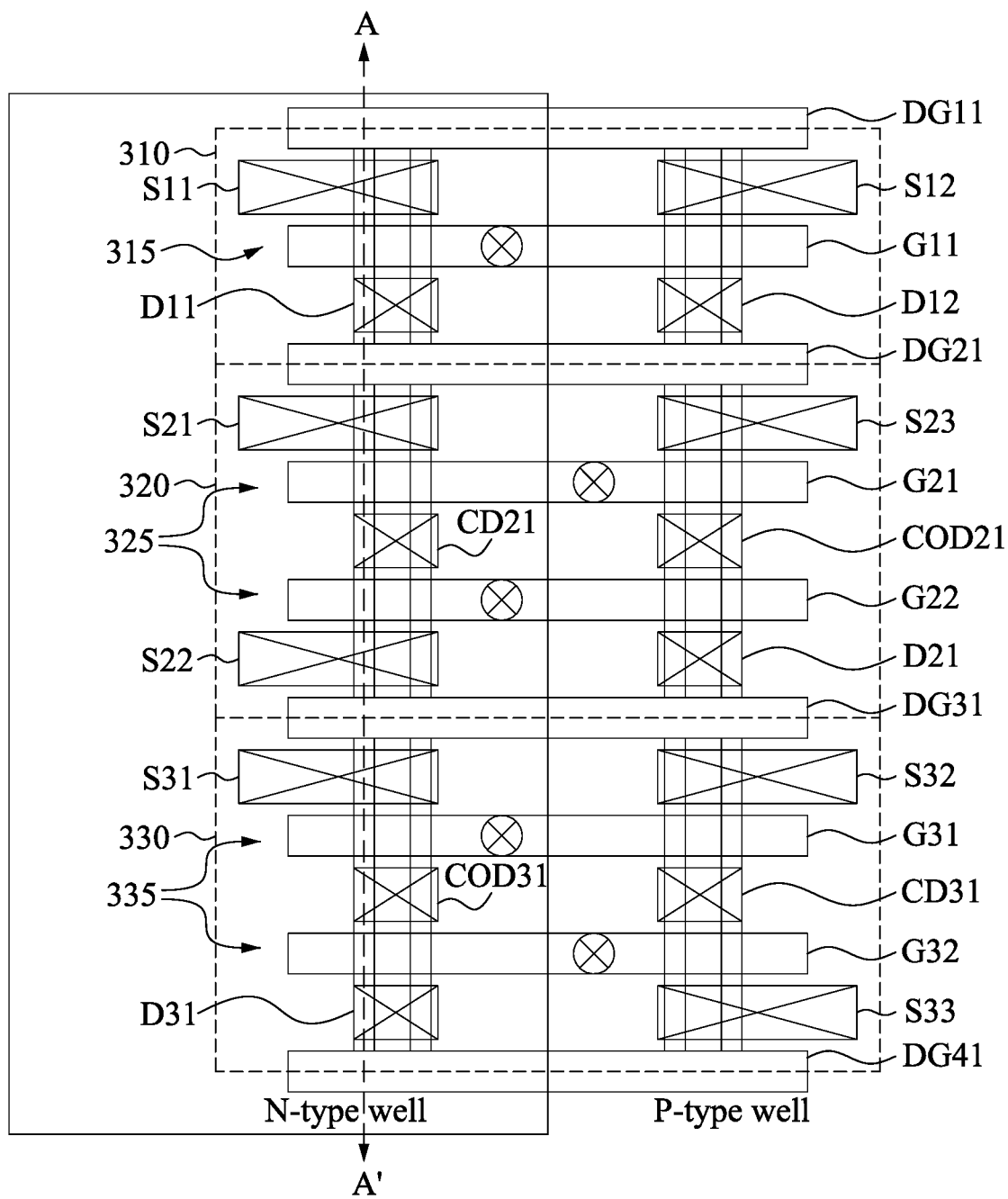
FIG. 3 is a top view of a semiconductor device, in accordance with various embodiments.

Reference is now made to FIG. 3. FIG. 3 is a fragmentary diagram illustrating configurations of cells, corresponding to the cells in FIG. 1, in a semiconductor device 300, in accordance with various embodiments. As illustrated in FIG. 3, the semiconductor device 300 includes a first STD cell 310 and a second STD cell 320. The first STD cell 310 includes a first circuit 315. The second STD cell 320 includes a second circuit 325. For illustration, the first circuit 315 includes a source S11, a gate G11, and a drain D11 that correspond to a FinFET transistor. The source S11 and the drain D11 are doped with a first doping material, and the source S11 and the drain D11 have a first doping concentration of the first doping material.

As illustrated in FIG. 3, the second circuit 325 includes a source S21, a gate G21, a common drain CD21, a gate G22, and a source S22. For illustration, the source S21, the gate G21, and the common drain CD21 correspond to a FinFET transistor, and the common drain CD21, the gate G22, and the source S22 correspond to another FinFET transistor. In some embodiments, a gate pitch, a gate critical dimension (CD) and work-function metal layers of the gate G11 in the first circuit 315 are the same as gate pitches, gate critical dimensions and work-function metal layers of the gates G21, G22 in the second circuit 325. The source S21, the common drain CD21, and the source S22 are doped with a second doping material, and the source S21, the common drain CD21, and the source S22 have a second doping concentration of the second doping material.

In some embodiments, the first doping concentration of the sources and drains of the first circuit 315 is different from the second doping concentration of the sources and drains of the second circuit 325. In various embodiments, the first doping concentration of the sources and drains of the first circuit 315 is higher than the second doping concentration of the sources and drains of the second circuit 325. Accordingly, the sources and drains of the first circuit 315 are also referred to as heavily doped sources and drains, in some embodiments.

In some embodiments, a difference between the first doping concentration and the second doping concentration is in a range of about 30-50%. In various embodiments, the difference between the first doping concentration and the second doping concentration is in a range of about 40-60%. In alternative embodiments, a difference between the first doping concentration and the second doping concentration is in a range of about 50-70%.

In some embodiments, the sources and the drains of the first circuit 315 and the second circuit 325 include SiGe, and boron is doped into the sources and the drains of the first circuit 315 and the second circuit 325. The sources and the drains of the first circuit 315 are doped with the boron of the first doping concentration, and the sources and the drains of the second circuit 325 are doped with the boron of the second doping concentration.

The material for forming the sources and drains of the first circuit 315 and the second circuit 325, as discussed above, is given for illustrative purposes. Various materials for forming the sources and drains of the first circuit 315 and the second circuit 325 are within the contemplated scope of the present disclosure. For example, in various embodiments, the drains and the sources of the first circuit 315 and the second circuit 325 includes material selected from the group consisting of SiGe, SiGeC, Ge, Si, and a combination thereof.

In some embodiments, each of the first circuit 315 and the second circuit 325 includes P-type FinFET transistors. In some embodiments, the FinFET transistors employ 2D-FinFET structures, 3D-FinFET structures, and/or a combination thereof.

As illustrated in FIG. 3, the semiconductor device 300 further includes a third STD cell 330, and the third STD cell 330 includes a third circuit 335. For illustration, the third circuit 335 includes a source S31, a gate G31, a common Oxide diffusion (OD) COD31, a gate G32, and a drain D31. The source S31 and the drain D31 are doped with the first doping material of the first doping concentration as discussed above.

For illustration, the first circuit 315 is disposed adjacent to the second circuit 325, and the second circuit 325 is disposed adjacent to the third circuit 335. In some embodiments, the semiconductor device 300 further includes shallow trench isolations (not shown), and one of the shallow trench isolations is disposed between the first circuit 315 and the second circuit 325 for isolating the first circuit 315 from the second circuit 325. In addition, one of the shallow trench isolations is disposed between the second circuit 325 and the third circuit 335 for isolating the second circuit 325 from the third circuit 335.

In some embodiments, the first circuit 315 is used in a logic circuit which is disposed outside of a Static Random-Access Memory (SRAM), while the second circuit 325 is used in the SRAM. In various embodiments, the first circuit 315 is used in a SARM, while the second circuit 325 is used in a logic circuit which is disposed outside of the SRAM. In some embodiments, the gates 315, 325, 335, as mentioned above, includes various structures selected from the group consisting of poly gate/SiON structures, metals/high-K dielectric structures, Al/refractory metals/high-K dielectric structures, silicide/high-K dielectric structures, and a combination thereof.

In some embodiments, the first circuit 315 further includes a source S12 and a drain D12, the second circuit 325 further includes a source S23, a common oxide diffusion (OD) COD21, and a drain D21, and the third circuit 335 further includes a source S32, a common drain CD31, and a source S33. For illustration, the source S12, the gate G11, and the drain D12 correspond to a FinFET transistor. The source S23, the gate G31, and the common drain CD31 correspond to a FinFET transistor, and the common drain CD31, the gate G32, and the source S33 correspond to another FinFET transistor.

In various embodiments, the semiconductor device 300 further includes a dummy gate DG11 disposed at, for illustration, the upper side of the first STD cell 310, a dummy gate DG21 disposed between the first STD cell 310 and the second STD cell 320, a dummy gate DG31 disposed between the second STD cell 320 and the third STD cell 330, and a dummy gate DG41 disposed at, for illustration, the lower side of the third STD cell 330.

In some embodiments, the STD cell 310 is operated as, but not limited to, an inverter, the STD cell 320 is operated as, but not limited to, a NAND gate, and the STD cell 330 is operated as, but not limited to, a NOR gate.

Figure 4:
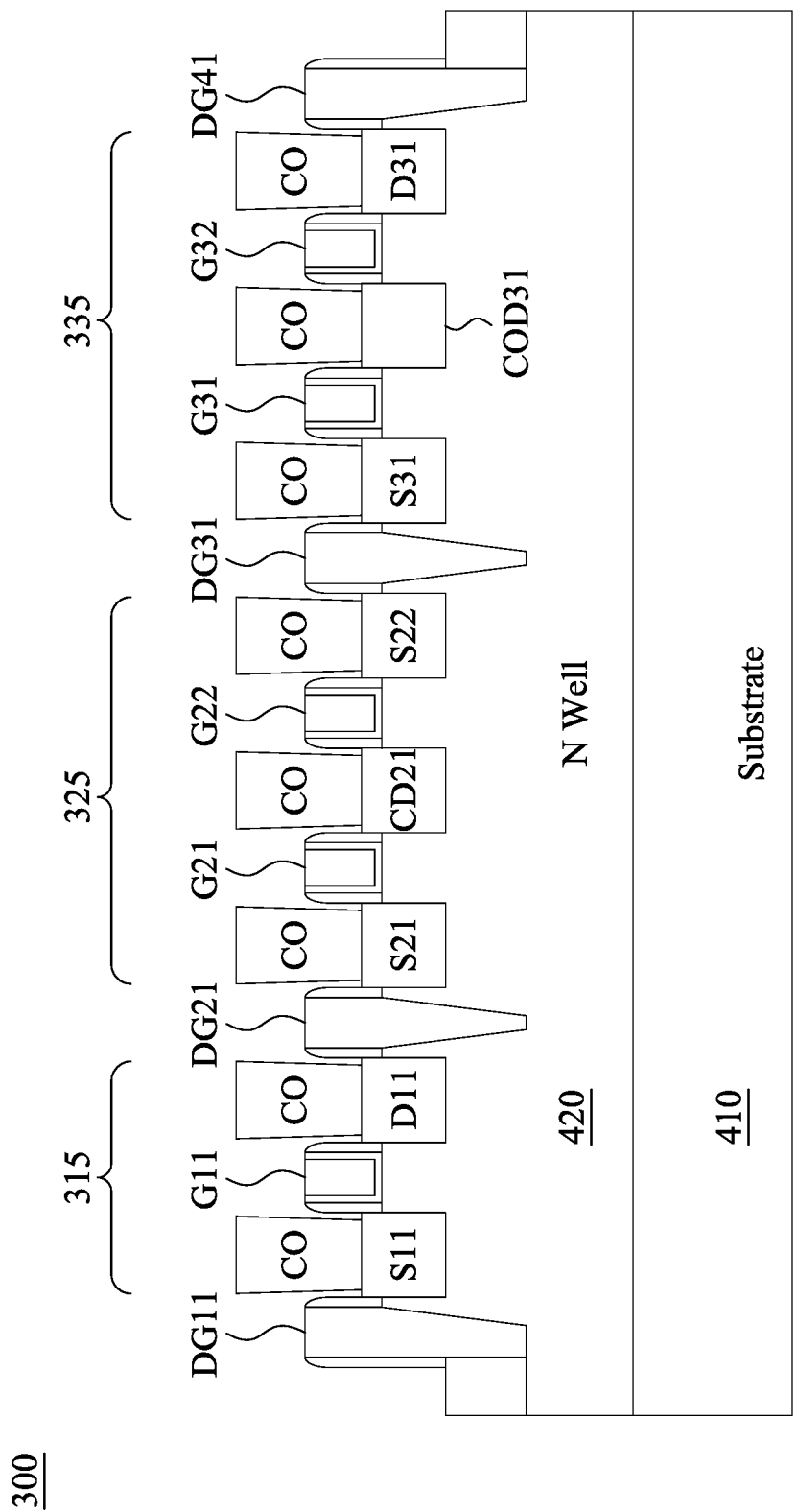
FIG. 4 is a cross-sectional view of the semiconductor device in FIG. 3, in accordance with various embodiments.

FIG. 4 is a cross-sectional view taken along line A-A' of the semiconductor device in FIG. 3, in accordance with various embodiments. As illustrated in FIG. 4, the semiconductor device 300 includes a substrate 410, an N well 420, the first circuit 315, the second circuit 325, the third circuit 335, the dummy gate DG11, the dummy gate DG21, the dummy gate DG31, and the dummy gate DG41.

As illustrated in FIG. 4, the N well 420 is formed on the substrate 410. The first circuit 315, the second circuit 325, and the third circuit 335 are formed on the N well 420, in which the dummy gates DG11, DG21, DG31, DG41 are formed in the N well 420. In some embodiments, the material of the substrate 410 in the semiconductor device 300 is selected from the group consisting of bulk-Si, SiP, SiGe, SiC, SiPC, Ge, SOI-Si, SOI-SiGe, III-VI material, and a combination thereof.

In some embodiments, the source S11 and the drain D11 in the first circuit 315 are heavily doped, and the source S31, the common oxide diffusion COD31 and the drain D31 in the third circuit 335 are heavily doped. The doping concentrations of the source S11 and the drain D11, and/or the source S31, the common oxide diffusion COD31 and the drain D31, are greater than the doping concentrations of the sources S21, S22 and the common drain CD31 in the second circuit 325. In further embodiments, the doping concentrations of the source S11 and the drain D11, and/or the source S31, the common oxide diffusion COD31 and the drain D31, are greater than the doping concentrations of the sources S21, S22 and the common drain CD31 by at least 20% or 30% of the doping concentrations of the sources S21, S22 and the common drain CD31.

For illustration with respect to the structure in FIG. 4, the first circuit 315 having heavier doped source S11 and heavier doped drain D11 is disposed next to the second circuit 325 having normal doped sources S21, S22 and common drain CD21. The second circuit 325 is disposed next to the third circuit 335 having heavier doped source S31 and heavier doped drain D31. For illustration in FIG. 4, the dummy gate DG11 is disposed at the leftmost side of the first circuit 315, the dummy gate DG21 is disposed between the first circuit 315 and the second circuit 325, the dummy gate DG31 is disposed between the second circuit 325 and the third circuit 335, and the dummy gate DG41 is disposed at the rightmost side of the third circuit 335.

Figure 5:
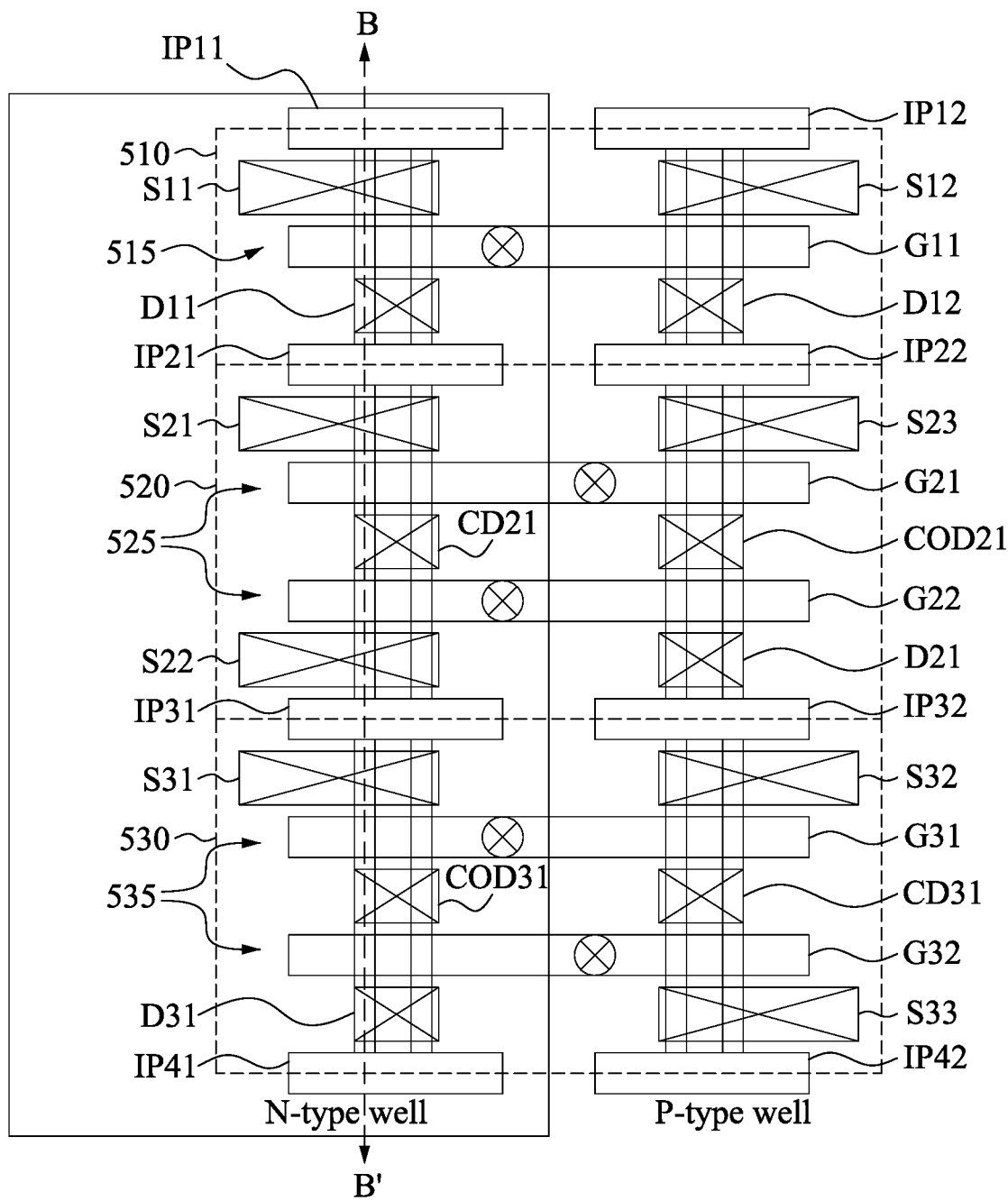
FIG. 5 is a top view of a semiconductor device, in accordance with various embodiments.

FIG. 5 is a fragmentary diagram illustrating configurations of cells, corresponding to the cells in FIG. 1, in a semiconductor device 500, in accordance with various embodiments. As illustrated in FIG. 5, the semiconductor device 500 includes a first STD cell 510 and a second STD cell 520. The first STD cell 510 includes a first circuit 515. The second STD cell 520 includes a second circuit 525. For illustration, the first circuit 515 includes a source S11, a gate G11, and a drain D11 that correspond to a FinFET transistor. The source S11 and the drain D11 are doped with a first doping material of the first doping concentration. In various embodiments, the source S11 and the drain D11 of the first circuit 515 are formed of SiGe, and boron is doped into the source S11 and the drain D11 of the first circuit 515. The S11 and the drain D11 of the first circuit 515 are doped with the boron of the first doping concentration.

As illustrated in FIG. 5, the second circuit 525 includes a source S21, a gate G21, a common drain CD21, a gate G22, and a source S22. For illustration, the source S21, the gate G21, and the common drain CD21 correspond to a FinFET transistor, and the common drain CD21, the gate G22, and the source S22 correspond to another FinFET transistor. In some embodiments, a gate pitch, a gate critical dimension (CD) and work-function metal layers of the gate G11 in the first circuit 515 are the same as gate pitches, gate critical dimensions and work-function metal layers of the gates G21, G22 in the second circuit 525. The source S21, the common drain CD21, and the source S22 are doped with a second doping material of the second doping concentration.

In various embodiments, the source S21, the common drain CD21, and the source S22 of the second circuit 525 are formed of SiGe, and boron is doped into the source S21, the common drain CD21, and the source S22 of the second circuit 525. The source S21, the common drain CD21, and the source S22 of the second circuit 525 are doped with the boron of the second doping concentration.

In some embodiments, each of the first circuit 515 and the second circuit 525 includes P-type FinFET transistors. In some embodiments, a difference between the first doping concentration and the second doping concentration is about 30-50%. In some embodiments, the difference between the first doping concentration and the second doping concentration is about 40-60%. In various embodiments, a difference between the first doping concentration and the second doping concentration is about 50-70%.

The material for forming the sources and drains of the first circuit 515 and the second circuit 525, as discussed above, is given for illustrative purposes. Various materials for forming the sources and drains of the first circuit 515 and the second circuit 525 are within the contemplated scope of the present disclosure. For example, in various embodiments, the drains and the sources of the first circuit 515 and the second circuit 525 includes material selected from the group consisting of SiGe, SiGeC, Ge, Si, and a combination thereof.

Similar to the semiconductor device 300 in FIG. 3, the semiconductor device 500 in FIG. 5 further includes a third circuit 535. For illustration, the third circuit 535 includes a source S31, a gate G31, a common oxide diffusion (OD) COD31, a gate G32, and a drain D31. In various embodiments, the source S31 and the drain D31 of the third circuit 535 is formed of SiGe, and boron is doped into the source S31 and the drain D31 of the third circuit 535. For illustration, the source S31 and the drain D31 of the third circuit 535 are doped with the boron of the first doping concentration. In some embodiments, the third circuit 535 includes P-type FinFET transistors.

Similar to the semiconductor device 300 in FIG. 3, for illustration, the first circuit 515 further includes a source S12 and a drain D12. The second circuit 525 further includes a source S23, a common Oxide diffusion (OD) COD21, and a drain D21. The third circuit 535 further includes a source S32, a common drain CD31, and a source S33. In some embodiments, the STD cell 510 is operated as, but not limited to, an inverter, the STD cell 520 is operated as, but not limited to, a NAND gate, and the STD cell 530 is operated as, but not limited to, a NOR gate.

In some embodiments, the difference between the semiconductor device 300 in FIG. 3 and the semiconductor device 500 in FIG. 5 is that the semiconductor device 500 in FIG. 5 includes isolation P-type MOSFETs IP11, IP12, IP21, IP22, IP31, IP32, IP41, IP42. In various embodiments, the P-type MOSFETs IP11, IP12 are disposed at the upper side of the first STD cell 510. The P-type MOSFETs IP21, IP22 are disposed between the first STD cell 510 and the second STD cell 520, and the P-type MOSFETs IP31, IP32 are disposed between the second STD cell 520 and the third STD cell 530. The P-type MOSFETs IP41, IP42 are disposed at the lower side of the third STD cell 530.

Figure 6:
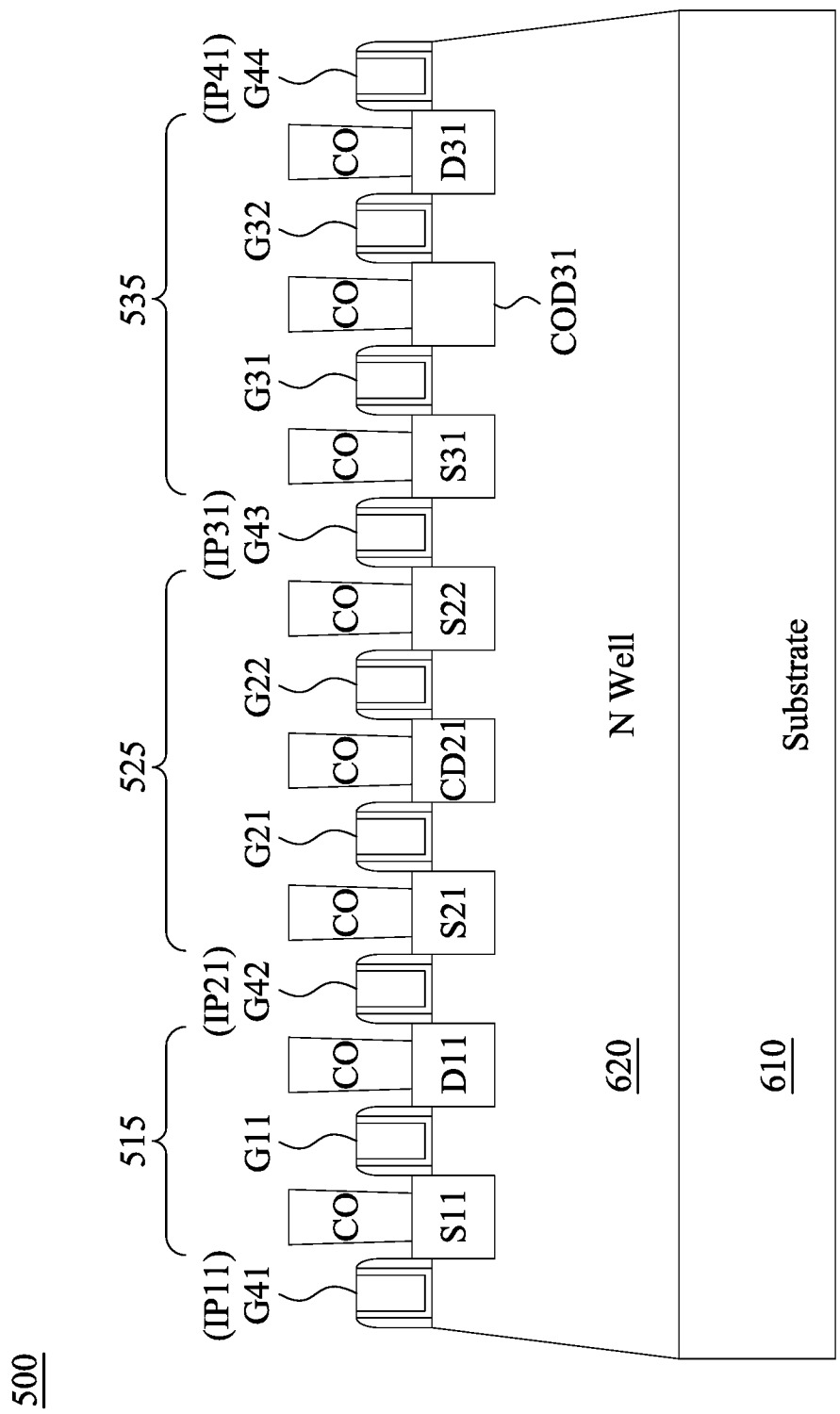
FIG. 6 is a cross-sectional view of the semiconductor device in FIG. 5, in accordance with various embodiments.

FIG. 6 is a cross-sectional view taken along line B-B' of the semiconductor device in FIG. 5, in accordance with various embodiments. As illustrated in FIG. 6, the semiconductor device 500 includes a substrate 610, an N well 620, the first circuit 515, the second circuit 525, the third circuit 535, and a plurality of gates G11, G21, G22, G31, G32, G41, G42, G43, G44.

As illustrated in FIG. 6, the N well 620 is formed on the substrate 610. The first circuit 515, the second circuit 525, and the third circuit 535 are formed on the N well 620, in which the gates G11, G21, G22, G31, G32, G41, G42, G43, G44 are formed in the N well 620.

In some embodiments, the source S11 and the drain D11 in the first circuit 515 are heavily doped, and the source S31, the common oxide diffusion COD31 and the drain D31 in the third circuit 535 are heavily doped as well. The doping concentrations of the source S11 and the drain D11, and/or the source S31, the common oxide diffusion COD31 and the drain D31, are greater than the doping concentrations of the sources S21, S22 and the common drain CD31 in the second circuit 525. In further embodiments, the doping concentrations of the source S11 and the drain D11, and/or the source S31, the common oxide diffusion COD31 and the drain D31, are greater than the doping concentrations of the sources S21, S22 and the common drain CD31 by at least 20% or 30% of the doping concentrations of the sources S21, S22 and the common drain CD31.

For illustration with respect to the structure in FIG. 6, the first circuit 515 having heavier doped source S11 and heavier doped drain D11 is disposed next to the second circuit 525 having normal doped sources S21, S22 and drain CD21. The second circuit 525 is disposed next to the third circuit 535 having heavier doped source S31 and heavier doped drain D31. For illustration in FIG. 6, the isolation P-type MOSFETs IP11 is disposed at the leftmost side of the first circuit 515, the isolation P-type MOSFETs IP21 is disposed between the first circuit 515 and the second circuit 525, the isolation P-type MOSFETs IP31 is disposed between the second circuit 525 and the third circuit 535, and the isolation P-type MOSFETs IP41 is disposed at the rightmost side of the third circuit 535.

Figure 7:
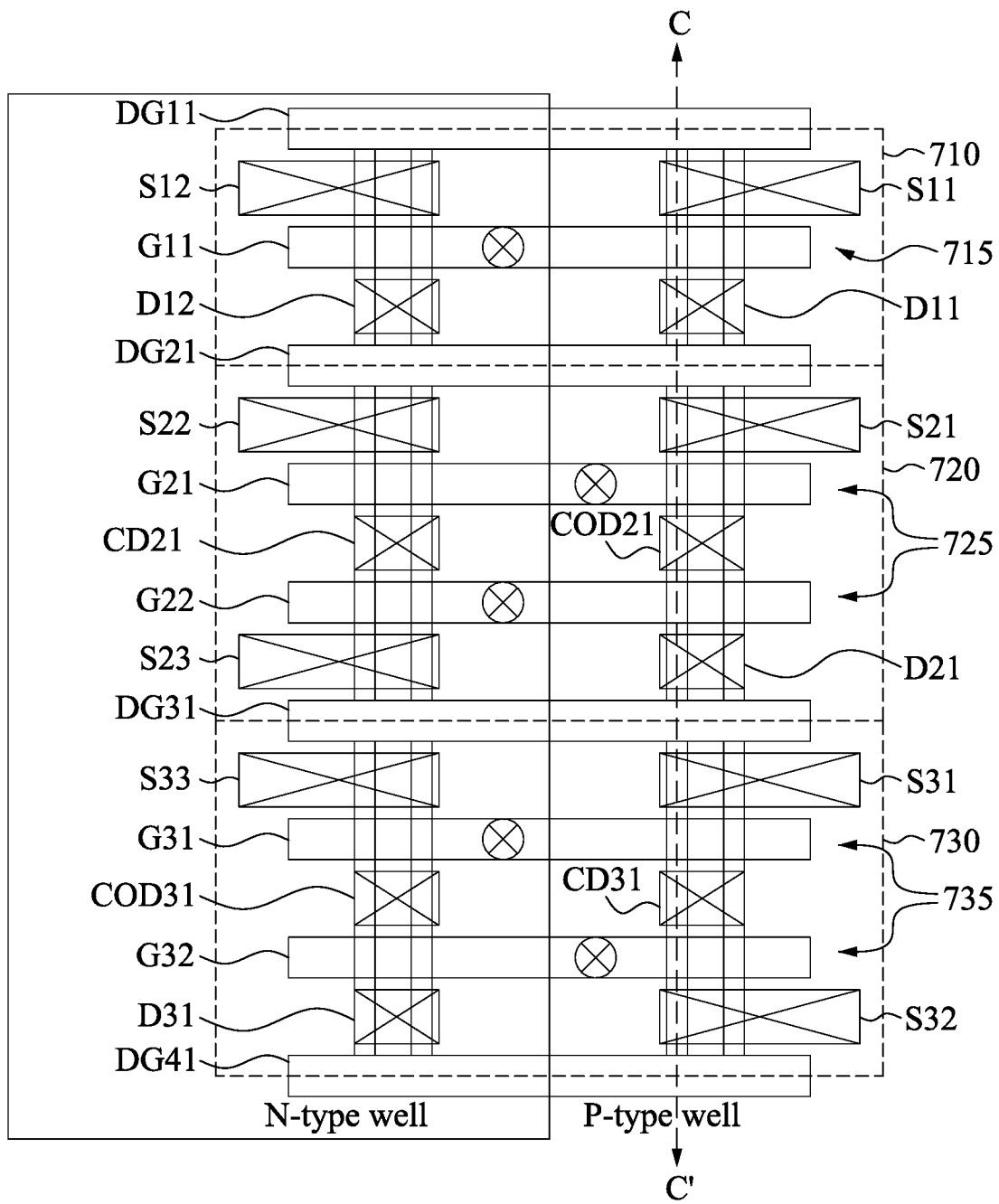
FIG. 7 is a top view of a semiconductor device, in accordance with various embodiments.

Reference is now made to FIG. 7. FIG. 7 is a fragmentary diagram illustrating configurations of cells, corresponding to the cells in FIG. 1, in a semiconductor device 700, in accordance with various embodiments. As illustrated in FIG. 7, the semiconductor device 700 includes a first STD cell 710 and a second STD cell 720. The first STD cell 710 includes a first circuit 715. The second STD cell 720 includes a second circuit 725. For illustration, the first circuit 715 includes a source S11, a gate G11, and a drain D11 that correspond to a FinFET transistor. The source S11 and the drain D11 are doped with a first doping material of the first doping concentration.

As illustrated in FIG. 7, the second circuit 725 includes a source S21, a gate G21, a common Oxide diffusion (OD) COD21, a gate G22, and a drain D21. In some embodiments, a gate pitch, a gate critical dimension (CD) and work-function metal layers of the gate G11 in the first circuit 715 are the same as gate pitches, gate critical dimensions and work-function metal layers of the gates G21, G22 in the second circuit 725. The source S21 and the drain D21 are doped with a second doping material of the second doping concentration, where the first concentration is different from the second concentration. In some embodiments, each of the first circuit 715 and the second circuit 725 includes N-type FinFET transistors.

In some embodiments, a difference between the first doping concentration and the second doping concentration is about 30-50%. In various embodiments, the difference between the first doping concentration and the second doping concentration is about 40-60%. In some embodiments, a difference between the first doping concentration and the second doping concentration is about 50-70%.

In various embodiments, the sources and the drains of the first circuit 715 and the second circuit 725 are formed of Si, and phosphorous is doped into the sources and the drains of the first circuit 715 and the second circuit 725, in which the sources and the drains of the first circuit 715 is doped with the phosphorous of the first doping concentration, and the sources and the drains of the second circuit 725 is doped with the phosphorous of the second doping concentration.

The material for forming the sources and drains of the first circuit 715 and the second circuit 725, as discussed above, is given for illustrative purposes. Various materials for forming the sources and drains of the first circuit 315 and the second circuit 325 are within the contemplated scope of the present disclosure. For example, in various embodiments, the drains and the sources of the first circuit 715 and the second circuit 725 includes material selected from the group consisting of SiP content, SiC content, SiPC, SiAs, Si, and a combination thereof.

As illustrated in FIG. 7, the semiconductor device 700 further includes a third STD cell 730, and the third STD cell 730 includes a third circuit 735. For illustration, the third circuit 735 includes a source S31, a gate G31, a common drain CD31, a gate G32, and a source S32. For illustration, the source S31, the gate G31, and the common drain CD31 correspond to a FinFET transistor, and the common drain CD31, the gate G32, and the source S32 correspond to another FinFET transistor. The source S31, the drain D31, and the source 32 are doped with the first doping material of the first doping concentration. The first doping concentration is different from the second doping concentration. In some embodiments, a difference between the first doping concentration and the second doping concentration is about 30-50%, about 40-60%, or about 50-70%.

In some embodiments, the first circuit 715 further includes a source S12 and a drain D12. The second circuit 725 further includes a source S22, a common drain CD21, and a source S23. The third circuit 735 further includes a source S33, a common oxide diffusion (OD) COD31, and a drain D31. For illustration, the source S12, the gate G11, and the drain D12 correspond to a FinFET transistor. The source S22, the gate G21, and the common drain CD21 correspond to a FinFET transistor, and the common drain CD21, the gate G22, and the source S23 correspond to another FinFET transistor.

In various embodiments, the semiconductor device 700 further includes a dummy gate DG11 disposed at, for illustration, the upper side of the first STD cell 710, a dummy gate DG21 disposed between the first STD cell 710 and the second STD cell 720, a dummy gate DG31 disposed between the second STD cell 720 and the third STD cell 730, and a dummy gate DG41 disposed at, for illustration, the lower side of the third STD cell 730.

In some embodiments, the STD cell 710 is operated as, but not limited to, an inverter, the STD cell 720 is operated as, but not limited to, a NAND gate, and the STD cell 730 is operated as, but not limited to, a NOR gate.

Figure 8:
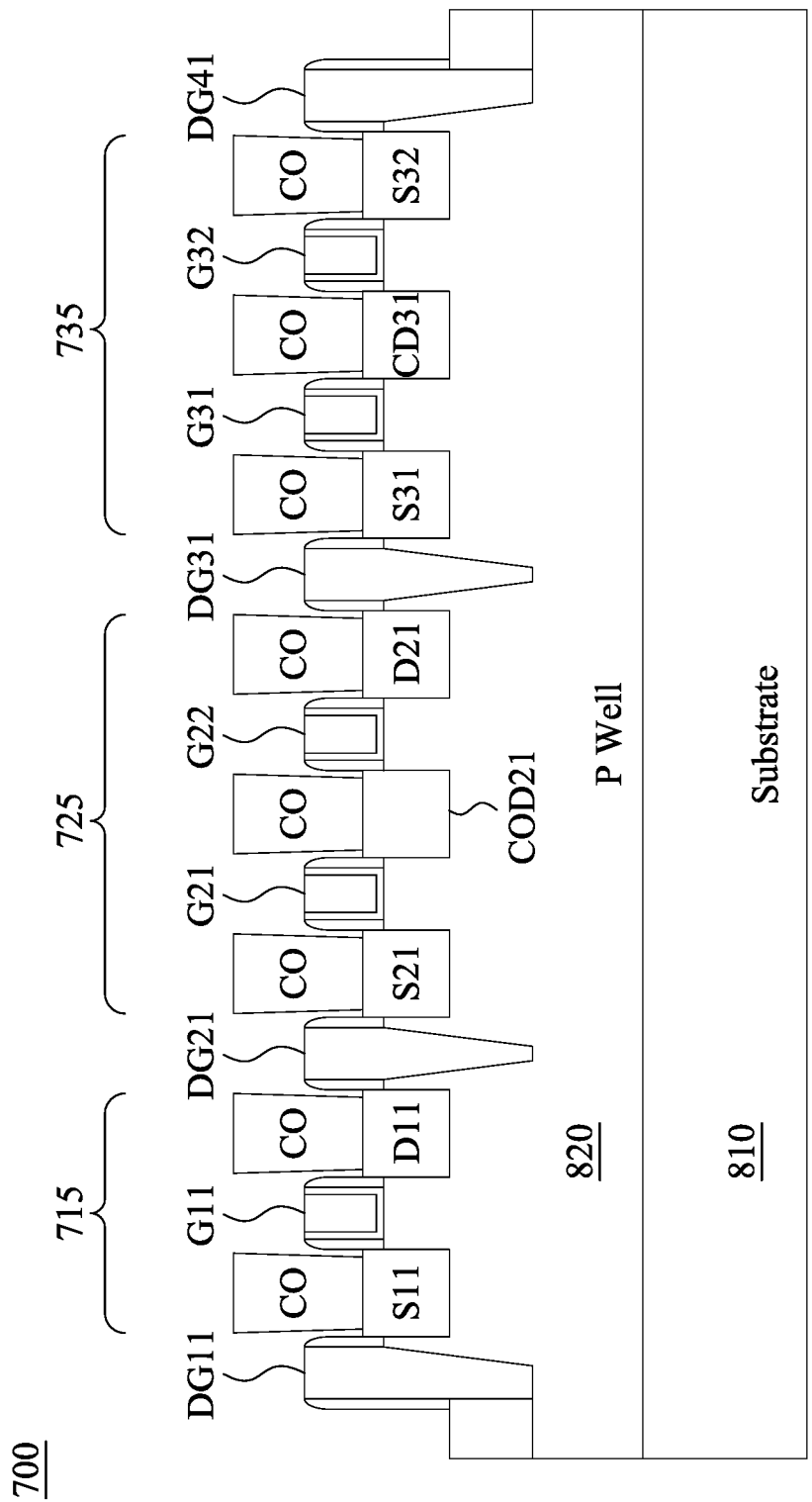
FIG. 8 is a cross-sectional view of the semiconductor device in FIG. 7, in accordance with various embodiments.

FIG. 8 is a cross-sectional view taken along line C-C' of the semiconductor device in FIG. 7, in accordance with various embodiments. As illustrated in FIG. 8, the semiconductor device 700 includes a substrate 810, a P well 820, the first circuit 715, the second circuit 725, the third circuit 735, the dummy gate DG11, the dummy gate DG21, the dummy gate DG31, and the dummy gate DG41.

In some embodiments, the source S11 and the drain D11 in the first circuit 715 are heavily doped, and the source S31, the common drain CD31, and the source S32 in the third circuit 735 are heavily doped. The doping concentrations of the source S11 and the drain D11, and/or the source S31, the common drain CD31, and the source S32, are greater than the doping concentrations of the source S21, the common oxide diffusion COD21, and the drain D21 in the second circuit 725. In further embodiments, the doping concentrations of the source S11 and the drain D11, and/or the source S31, the common drain CD31, and the source S32, are greater than the doping concentrations of the source S21, the common oxide diffusion COD21, and the drain D21 by at least 20% or 30% of the doping concentrations of the source S21, the common oxide diffusion COD21, and the drain D21.

For illustration with respect to the structure in FIG. 8, the first circuit 715 having heavier doped source S11 and heavier doped drain D11 is disposed adjacent to the second circuit 725 having normal doped sources S21 and drain D21. The second circuit 725 having normal doped source S21 and drain D21 is disposed adjacent to the third circuit 735 having heavier doped source S31, the common drain D31, and heavier doped source S32. For illustration in FIG. 8, the dummy gate DG11 is disposed at the leftmost side of the first circuit 715, the dummy gate DG21 is disposed between the first circuit 715 and the second circuit 725, the dummy gate DG31 is disposed between the second circuit 725 and the third circuit 735, and the dummy gate DG41 is disposed at the rightmost side of the third circuit 735.

Figure 9:
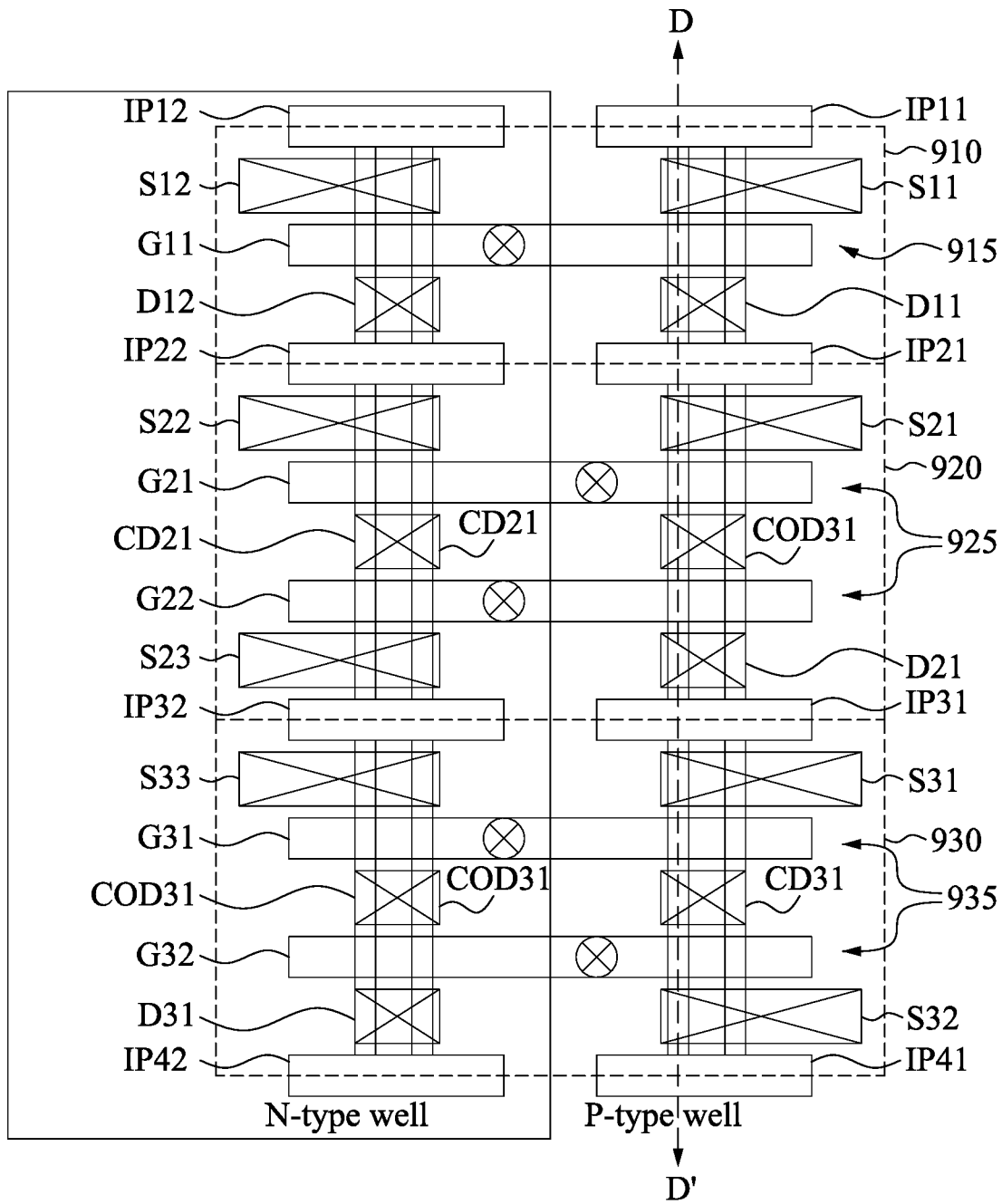
FIG. 9 is a top view of a semiconductor device, in accordance with various embodiments.

FIG. 9 is a fragmentary diagram illustrating configurations of cells, corresponding to the cells in FIG. 1, in a semiconductor device 500, in accordance with various embodiments. As illustrated in FIG. 9, the semiconductor device 900 includes a first STD cell 910 and a second STD cell 920. The first STD cell 910 includes a first circuit 915. The second STD cell 920 includes a second circuit 925. For illustration, the first circuit 915 includes a source S11, a gate G11, and a drain D11 that correspond to a FinFET transistor. The source S11 and the drain D11 are doped with a first doping material of the first doping concentration. In various embodiments, the source S11 and the drain D11 of the first circuit 915 are formed of Si, and phosphorous is doped into the source S11 and the drain D11 of the first circuit 915. The S11 and the drain D11 of the first circuit 915 are doped with the phosphorous of the first doping concentration. In some embodiments, the first circuit 915 includes N-type FinFET transistors.

As illustrated in FIG. 9, the second circuit 925 includes a source S21, a gate G21, a common oxide diffusion (OD) COD21, a gate G22, and a drain D21. A gate pitch, a gate critical dimension (CD) and work-function metal layers of the gate G11 in the first circuit 915 are the same as gate pitches, gate critical dimensions and work-function metal layers of the gates G21, G22 in the second circuit 925. The source S21 and the drain D21 are doped with a second doping material of the second doping concentration. The first doping concentration is different from the second doping concentration.

In some embodiments, the source S21 and the drain D21 of the second circuit 925 are formed of Si, and phosphorous is doped into the source S21 and the drain D21 of the second circuit 925. The source S21 and the drain D21 are doped with the phosphorous of the second doping concentration. In some embodiments, the second circuit 925 includes N-type FinFET transistors.

In various embodiments, a difference between the first doping concentration and the second doping concentration is about 30-50%. In some embodiments, the difference between the first doping concentration and the second doping concentration is about 40-60%. In various embodiments, a difference between the first doping concentration and the second doping concentration is about 50-70%.

Similar to the semiconductor device 700 in FIG. 7, the semiconductor device 900 in FIG. 9 further includes a third circuit 930. For illustration, the third circuit 930 includes a source S31, a gate G31, a common drain CD31, a gate G32, and a source S32. For illustration, the source S31, the gate G31, and the common drain CD31 correspond to a FinFET transistor, and the common drain CD31, the gate G32, and the source S32 correspond to another FinFET transistor. In various embodiments, the source S31, the common drain CD31, and the source S32 of the third circuit 935 are formed of Si, and phosphorous is doped into the source S31, the common drain CD31, and the source S32 of the third circuit 935. For illustration, the source S31, the common drain CD31, and the source S32 are doped with the phosphorous of the first doping concentration. In some embodiments, the third circuit 935 includes N-type FinFET transistors. In some embodiments, a difference between the first concentration and the second concentration is about 30-50%, about 40-60%, or about 50-70%.

Similar to the semiconductor device 700 in FIG. 7, for illustration, the first circuit 915 further includes a source S12 and a drain D12. The second circuit 925 further includes a source S22, a common drain CD21, and a source S23. The third circuit 935 further includes a source S33, a common oxide diffusion (OD) COD31, and a drain D31. In some embodiments, the STD cell 910 is operated as, but not limited to, an inverter, the STD cell 920 is operated as, but not limited to, a NAND gate, and the STD cell 930 is operated as, but not limited to, a NOR gate.

In some embodiments, the difference between the semiconductor device 700 in FIG. 7 and the semiconductor device 900 in FIG. 9 is that the semiconductor device 900 in FIG. 9 includes isolation P-type MOSFETs IP11, IP12, IP21, IP22, IP31, IP32, IP41, IP42. In some embodiments, the P-type MOSFETs IP11, IP12 are disposed at the upper side of the first STD cell 910, the P-type MOSFETs IP21, IP22 are disposed between the first STD cell 910 and the second STD cell 920, the P-type MOSFETs IP31, IP32 are disposed between the second STD cell 920 and the third STD cell 930, and the P-type MOSFETs IP41, IP42 are disposed at the lower side of the third STD cell 930.

Figure 10:
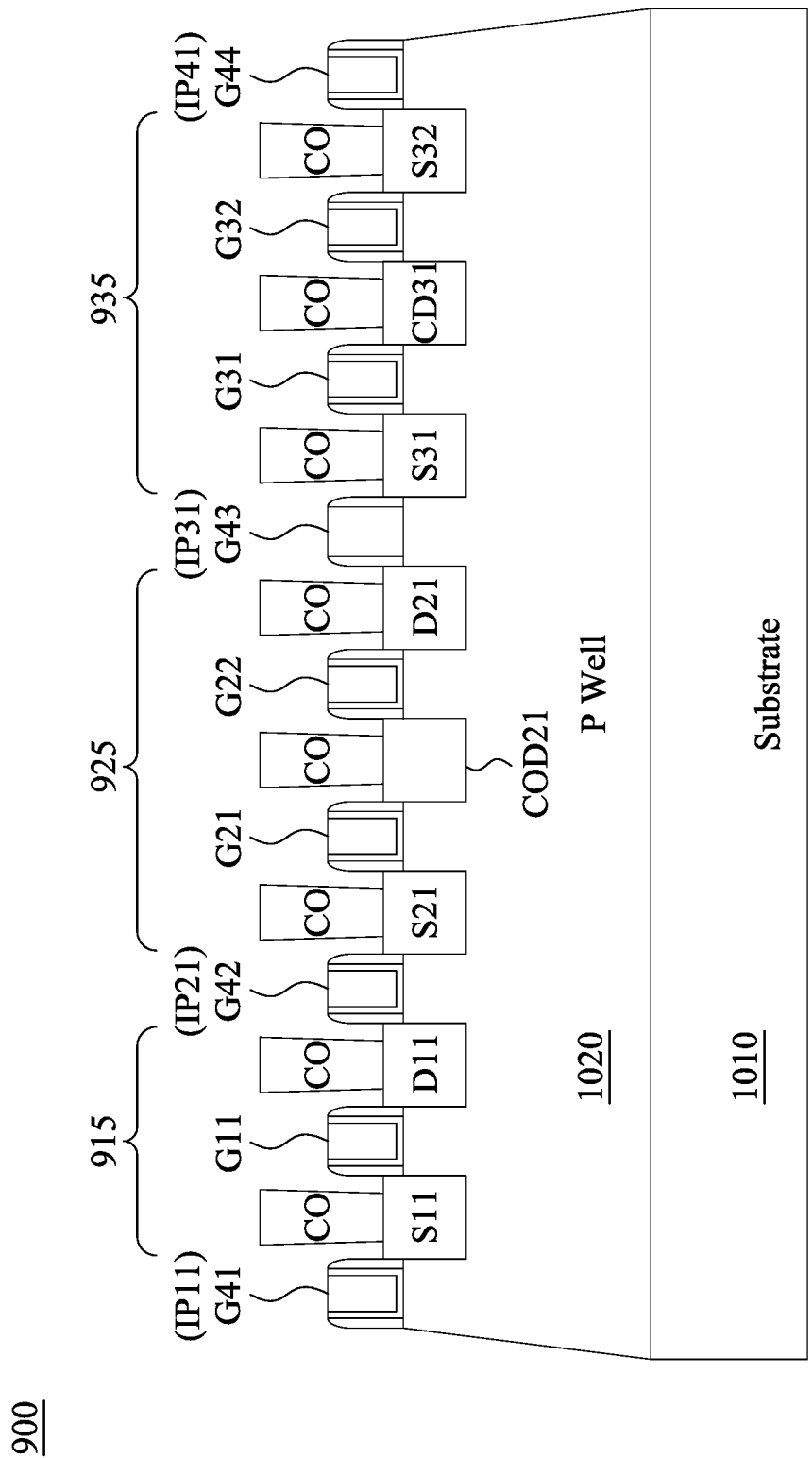
FIG. 10 is a cross-sectional view of the semiconductor device in FIG. 9, in accordance with various embodiments.

FIG. 10 is a cross-sectional view taken along line D-D' of the semiconductor device in FIG. 9, in accordance with various embodiments. As illustrated in FIG. 10, the semiconductor device 900 includes a substrate 1010, a P well 1020, the first circuit 915, the second circuit 925, the third circuit 935, and a plurality of gates G11, G21, G22, G31, G32, G41, G42, G43, G44.

As illustrated in FIG. 10, the P well 1020 is formed on the substrate 1010. The first circuit 915, the second circuit 925, and the third circuit 935 are formed on the P well, in which the gates G11, G21, G22, G31, G32, G41, G42, G43, G44 are formed in the P well 1020. In some embodiments, the first circuit 915 has heavier doped source S11 and heavier doped drain D11, and the third circuit 935 has heavier doped source S31 and heavier doped drain D31, compared to the source S21, the common oxide diffusion COD21, and the drain D21 in the second circuit 925 has. In further embodiments, the doping concentrations of the source S11 and the drain D11, and/or the sources S31, S32, and the common drain CD31, are greater than the doping concentrations of the source S21, the common oxide diffusion COD21, and the drain D21 by at least 20% or 30% of the doping concentrations of the source S21, the common oxide diffusion COD21, and the drain D21.

For illustration with respect to the structure in FIG. 10, the first circuit 915 having heavier doped source S11 and heavier doped drain D11 is disposed adjacent to the second circuit 925 having normal doped source S21 and drain D21. The second circuit 925 is disposed adjacent to the third circuit 935 having heavier doped source S31, heavier doped drain D31, and heavier doped source S32. For illustration in FIG. 10, with respect to position, the isolation P-type MOSFETs IP11 is disposed at the leftmost side of the first circuit 915, the isolation P-type MOSFETs IP21 is disposed between the first circuit 915 and the second circuit 925, the isolation P-type MOSFETs IP31 is disposed between the second circuit 925 and the third circuit 935, and the isolation P-type MOSFETs IP41 is disposed at the rightmost side of the third circuit 935.

Figure 11:
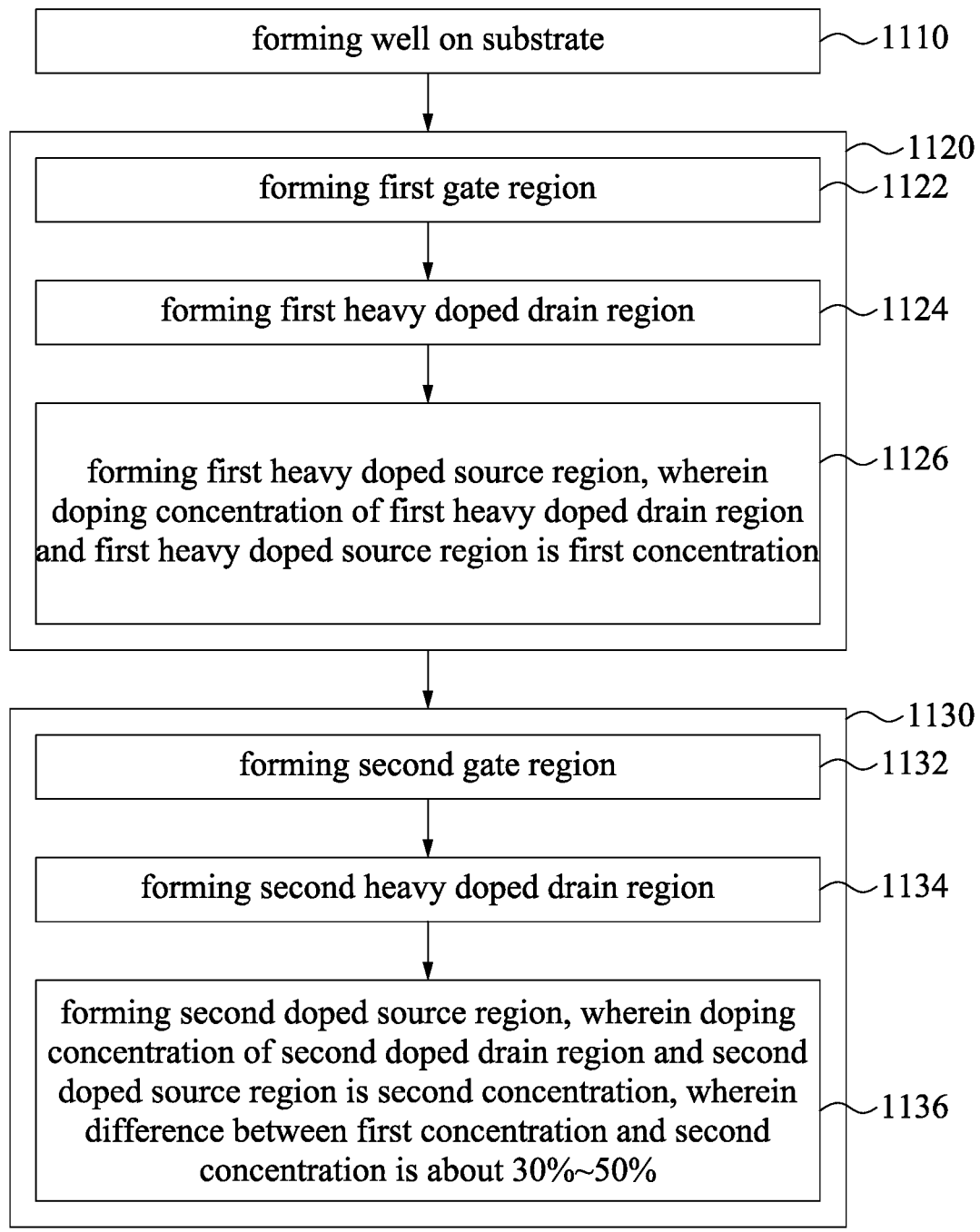
FIG. 11 is a diagram of a flow chart of a method for manufacturing a semiconductor device, in accordance with various embodiments.

FIG. 11 is a diagram of a flow chart of a method for manufacturing a semiconductor device, in accordance with various embodiments. As illustrated in FIG. 11, the method 1100 is preformed to manufacture, for illustration, the semiconductor devices 300, 500, 700, 900 in FIGS. 3-10. For illustrative purposes, FIG. 11 is discussed below with reference to FIG. 10.

In operation 1110, the P well 1020 is formed on the substrate 1010.

In operation 1120, there are operations 1122, 1124, 1126 to form the first circuit 915. Referring to operation 1122, the first gate region G11 is formed in the P well 1020. In operation 1124, the first heavy doped drain region D11 is formed in the P well 1020. Referring to operation 1126, the first heavy doped source region S11 is formed in the P well 1020, wherein the doping concentration of the first heavy doped drain region D11 and the first heavy doped source region S11 is the first doping concentration.

Reference is now made to operation 1130, there are operations 1132, 1134, 1136 to form the second circuit 925 in the P well 1020 and to dispose the second circuit 925 adjacent to the first circuit 915. In operation 1132, the second gate regions G21, G22 are formed in the P well 1020. Referring to operation 1134, the second heavy doped drain region D21 is formed in the P well 1020. Referring to operation 1136, the second heavy doped source region S21 is formed in the P well 1020, wherein the doping concentration of the second heavy doped drain region D21 and the second heavy doped source region S21 is second doping concentration, wherein a difference between the first doping concentration and the second doping concentration is about 30-50%.

In some embodiments, the first heavy doped drain region D11 and the first heavy doped source region S11 manufactured by the method 1100 are formed of SiGe, and boron is doped into the first heavy doped drain region D11 and the first heavy doped source region S11. In various embodiment, the first heavy doped drain region D11 and the first heavy doped source region S11 manufactured by the method 1100 are formed of Si, and phosphorous is doped into the first heavy doped drain region D11 and the first heavy doped source region S11.

In various embodiments, the method 1100 is preformed to form a shallow trench isolation disposed between the first transistor and the second transistor for isolating the first transistor and the second transistor. In some embodiments, the first transistor and the second transistor comprise at least one of P-type transistor and N-type transistor. In various embodiments, the first transistor and the second transistor comprises fin field effect transistors (FET) each employing a single fin.

In some embodiments, a semiconductor device is disclosed that includes a first cell and a second cell. The first cell includes a first circuit, and the first circuit includes a first gate. The second cell is disposed adjacent to the first cell and includes a second circuit, which includes a second gate. A doping concentration of the first circuit is different from the doping concentration of the second circuit, and the first gate and the second gate have the same gate critical dimension.

In some embodiments, the first gate and the second gate have the same gate pitch.

In some embodiments, the first circuit includes a first drain and a first source, and the second circuit includes a second drain and a second source. The first drain and the first source are doped with a first concentration, and the second drain and the second source are doped with a second concentration. The first concentration is different from the second concentration by at least 30%.

In some embodiments, the second circuit includes a third gate and a third source. The second gate, the second drain and the second source correspond to a transistor. The third gate, the second drain and the third source correspond to another transistor. The third source is doped with the second concentration.

In some embodiments, the first circuit includes semiconductor material, and the second circuit includes the same semiconductor material. The semiconductor material of the first circuit is doped with a first concentration by doping material, and the semiconductor material of the second circuit is doped with a second concentration by the same doping material. The first concentration is different from the second concentration by at least 30%.

In some embodiments, the semiconductor device further includes a third cell. The third cell is disposed adjacent to the second cell which is disposed between the first cell and the third cell. The third cell includes a third circuit. A doping concentration of the third circuit is the same as the doping concentration of the first circuit.

In some embodiments, the semiconductor device further includes a plurality of shallow trench isolations. The shallow trench isolations are disposed between the first circuit and the second circuit, and also disposed between the second circuit and the third circuit.

In some embodiments, the first gate and the second gate corresponds to transistors of the same type.

Also disclosed is a semiconductor device that includes a first gate region of a first transistor of a first type, a first drain region and a first source region of the first transistor, a second gate region of a second transistor of the first type, and a second drain region and a second source region of the second transistor. The second gate region of a second transistor of the first type is formed adjacent to the first gate region. The first drain region and the first source region of the first transistor are doped with a first concentration, and the second drain region and the second source region of the second transistor are doped with a second concentration different from the first concentration. A gate critical dimension of the second gate region is the same as the gate critical dimension of the first gate region.

In some embodiments, a gate pitch of the second gate region is the same as the gate pitch of the first gate region.

In some embodiments, the semiconductor device further includes a substrate and a well. The well is formed on the substrate. The first transistor and the second transistor are formed in the well.

In some embodiments, the first concentration is different from the second concentration by at least 20%.

In some embodiments, the first drain region and the first source region include semiconductor material, and the second drain region and the second source region include the same semiconductor material. The semiconductor material of the first drain region and the first source region are doped with the first concentration by doping material, and The semiconductor material of the second drain region and the second source region are doped with the second concentration by the same doping material.

In some embodiments, the semiconductor device further includes a third drain region and a third source region of a third transistor of a second type, and a fourth drain region and a fourth source region of a fourth transistor of the second type. The third drain region and the third source region are doped with the first concentration and formed adjacent to the first drain region and the first source region. The fourth drain region and the fourth source region are doped with the second concentration and formed adjacent to both of the second drain region and the second source region, and the third drain region and the third source region.

In some embodiments, the first gate region, the third drain region and the third source region corresponds to the third transistor which is adjacent to the first transistor. The second gate region, the fourth drain region and the fourth source region corresponds to the fourth transistor which is adjacent to both of the second transistor and the third transistor.

Also disclosed is a method that includes: forming a first cell which includes a first circuit; and forming a second cell which is disposed adjacent to the first cell and includes a second circuit. The step of forming the first cell includes: forming a first gate region with a gate pitch and a gate critical dimension; and forming a first source/drain region doped with a first concentration. The step of forming the second cell includes: forming a second gate region with the gate pitch and the gate critical dimension; and forming a second source/drain region doped with a second concentration different from the first concentration.

In some embodiments, the first concentration is different from the second concentration by about 30%-50%.

In some embodiments, the step of forming the first cell further includes: forming the first gate region in a well on a substrate; and forming the first source/drain region in the well. The step of forming the second cell further includes: forming the second gate region in the well; and forming the second source/drain region in the well.

In some embodiments, the step of the method further includes: forming shallow trench isolation disposed between the first circuit and the second circuit.

In some embodiments, the step of the method further includes: forming a dummy gate region disposed between the first source/drain region and the second source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first cell comprising a first circuit, wherein the first circuit includes a first gate, a first source, and a first drain;
    a second cell disposed adjacent to the first cell and comprising a second circuit, wherein the second circuit includes a second gate, a second source, and a second drain; and
    a third cell disposed adjacent to the second cell and comprising a third circuit, wherein the third circuit includes a third source and a third drain,
    wherein a doping concentration of the first source and the first drain is different from a doping concentration of the second source and the second drain, wherein the doping concentration of the first source and the first drain is the same as a doping concentration of the third source and the third drain.

2. The semiconductor device of claim 1, wherein the first gate and the second gate have a same gate pitch.

3. The semiconductor device of claim 1, wherein
    the first drain and the first source are doped with a first concentration,
    the second drain and the second source are doped with a second concentration, and
    the first concentration is different from the second concentration by at least 30%.

4. The semiconductor device of claim 3, wherein
    the second circuit includes a third gate and a fourth source,
    wherein the second gate, the second drain and the second source correspond to a transistor, and the third gate, the second drain and the fourth source correspond to another transistor, and
    the fourth source is doped with the second concentration.

5. The semiconductor device of claim 1, wherein
    the first circuit includes semiconductor material, doped with a first concentration by doping material,
    the second circuit includes the semiconductor material, doped with a second concentration by the doping material, and
    the first concentration is different from the second concentration by at least 30%.

6. The semiconductor device of claim 1,
wherein the second cell is disposed between the first cell and the third cell.

7. The semiconductor device of claim 6, further comprising:
a plurality of shallow trench isolations disposed between the first circuit and the second circuit, and disposed between the second circuit and the third circuit.

8. The semiconductor device of claim 1, wherein
the first gate and the second gate correspond to transistors of a same type.

9. A semiconductor device, comprising:
a first gate region of a first transistor of a first type;
a first drain region and a first source region of the first transistor, doped with a first concentration;
a second gate region of a second transistor of the first type, formed adjacent to the first gate region;
a second drain region and a second source region of the second transistor, doped with a second concentration different from the first concentration; and
a third drain region and a third source region of a third transistor, wherein the first gate region, the third drain region, and the third source region correspond to the third transistor which is adjacent to the first transistor.

10. The semiconductor device of claim 9, wherein a gate pitch of the second gate region is the same as the gate pitch of the first gate region.

11. The semiconductor device of claim 9, further comprising:
a substrate; and
a well, formed on the substrate,
wherein the first transistor and the second transistor are formed in the well.

12. The semiconductor device of claim 9, wherein
the first concentration is different from the second concentration by at least 20%.

13. The semiconductor device of claim 9, wherein
the first drain region and the first source region include semiconductor material, doped with the first concentration by doping material,
the second drain region and the second source region include the semiconductor material, doped with the second concentration by the doping material.

14. The semiconductor device of claim 9, wherein the third drain region and the third source region of the third transistor of a second type are doped with the first concentration and formed adjacent to the first drain region and the first source region, and the semiconductor device further comprises:
a fourth drain region and a fourth source region of a fourth transistor of the second type, doped with the second concentration and formed adjacent to both the second drain region and the second source region, and the third drain region and the third source region.

15. The semiconductor device of claim 14,
wherein
the second gate region, the fourth drain region and the fourth source region correspond to the fourth transistor which is adjacent to both the second transistor and the third transistor.

16. A semiconductor device, comprising:
a first circuit including a first gate and doped with a first concentration; and
a second circuit disposed next to the first circuit, wherein the second circuit includes a second gate, a first source/drain, a second source/drain, a third second source/drain, and a third gate, wherein the first circuit further includes a fourth source/drain and a fifth source/drain that are doped with the first concentration, and the first source/drain, the second source/drain, and the third second source/drain are doped with a second concentration that is different from the first concentration.

17. The semiconductor device of claim 16, further comprising:
a third circuit doped with the first concentration,
wherein the second circuit is disposed between the first circuit and the third circuit.

18. The semiconductor device of claim 16, wherein
the second gate is disposed between the first source/drain and the second source/drain, wherein the second gate, the first source/drain, and the second source/drain correspond to a first transistor, and
the third gate is disposed between the second source/drain and a third source/drain, wherein the third gate, the second source/drain, and the third source/drain correspond to a second transistor.

19. The semiconductor device of claim 18, wherein
the first gate is disposed between the fourth source/drain and the fifth source/drain, wherein the first gate, the fourth source/drain, and the fifth source/drain correspond to a third transistor, and the first concentration is different from the second concentration by at least 30%.

20. The semiconductor device of claim 19, wherein
the first gate, the second gate, and the third gate have gate pitches that are the same, and
the first transistor, the second transistor, and the third transistor are a same type.

* * * * *